United States Patent
Vijayaraghavan et al.

(10) Patent No.: US 10,523,155 B2
(45) Date of Patent: Dec. 31, 2019

(54) LOW-VOLTAGE CRYSTAL OSCILLATOR CIRCUIT COMPATIBLE WITH GPIO

(71) Applicant: Microchip Technology Incorporated, Chandler, AZ (US)

(72) Inventors: Rajan Vijayaraghavan, Chandler, AZ (US); Ajay Kumar, Phoenix, AZ (US); Kiran Karnik, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 42 days.

(21) Appl. No.: 15/987,398

(22) Filed: May 23, 2018

(65) Prior Publication Data
US 2019/0044479 A1   Feb. 7, 2019

Related U.S. Application Data

(60) Provisional application No. 62/542,050, filed on Aug. 7, 2017.

(51) Int. Cl.
*H03B 5/36* (2006.01)
*H03B 5/06* (2006.01)
*H03L 1/02* (2006.01)

(52) U.S. Cl.
CPC ............... *H03B 5/364* (2013.01); *H03B 5/06* (2013.01); *H03L 1/028* (2013.01); *H03B 2200/0012* (2013.01); *H03B 2200/0094* (2013.01)

(58) Field of Classification Search
CPC . H03B 5/36; H03B 5/364; H03B 5/06; H03B 2200/0012; H03B 2200/0094; H03L 1/028

USPC .................. 331/158, 116 FE, 108 C
See application file for complete search history.

(56) References Cited

U.S. PATENT DOCUMENTS

2011/0204983 A1   8/2011   Akaike et al. ............ 331/116 R
2016/0218671 A1*  7/2016   Jun ........................ H03B 5/362

OTHER PUBLICATIONS

Rodahl, Michael et al., "On the Measurement of Thin Liquid Overlayers with the Quartz-Crystal Microbalance," Sensors and Actuators A: Physical, vol. 54, No. 1-3, pp. 448-456, Jun. 30, 1996.
Santo-Zarnik, Marina et al., "Design for Test of Crystal Oscillators: A Case Study," Journal of Electronic Testing: Theory and Application, vol. 11, No. 2, pp. 109-117, May 22, 1997.
International Search Report and Written Opinion, Application No. PCT/US2018/045309, 16 pages, dated Nov. 22, 2018.

* cited by examiner

*Primary Examiner* — Arnold M Kinkead
(74) *Attorney, Agent, or Firm* — Slayden Grubert Beard PLLC

(57) ABSTRACT

Low voltage crystal oscillator having native NMOS transistors used for coupling/decoupling to/from GPIO. The native NMOS transistors function properly at a low supply voltage when on (low resistance) and a high supply voltage when off (high resistance). Oscillator Gm driver bias resistors are repurposed to degenerate the native NMOS transistors when they are off, thereby reducing the leakage current thereof (oscillator circuit decoupled from GPIO nodes). This ensures compliance with the CMOS IIH leakage current specification during an external clock (EC) mode at a high supply voltage.

20 Claims, 3 Drawing Sheets

LOW-VOLTAGE CRYSTAL OSCILLATOR CIRCUIT COMPATIBLE WITH GPIO

RELATED PATENT APPLICATION

This application claims priority to commonly owned U.S. Provisional Patent Application No. 62/542,050; filed Aug. 7, 2017; which is hereby incorporated by reference herein for all purposes.

TECHNICAL FIELD

The present disclosure relates to oscillators and, in particular, to low voltage crystal oscillator circuits that are compatible with the complementary metal oxide semiconductor (CMOS) input-leakage high (IIH) specification for shared general-purpose input-output (GPIO) nodes.

BACKGROUND

Operation of low voltage crystal oscillator circuits coupled with general-purpose input-output (GPIO) nodes, e.g., connection pads of an integrated circuit (IC) is a desired feature in today's integrated circuit offerings. However, low-voltage operation of a N-channel metal oxide semiconductor (NMOS) Gm-driver based crystal oscillator circuit is limited by the minimum Vdd (supply voltage) required to turn ON series isolation switches between the crystal oscillator circuits and the GPIO pads (see FIG. 1). The voltage required at a minimum is: 1-NMOS diode+the threshold voltage (Vt) of the NMOS switch. Normally these isolation switches are implemented as 3.3V capable standard Vt NMOS switches to guarantee lowest leakage current when disabled, thereby decoupling the crystal oscillator Gm-driver circuit from the GPIO pads of the IC. This insures meeting the CMOS IIH specification when using the GPIO pads in other configurations besides as connections for an external frequency determining crystal and associated components thereto.

But to guarantee crystal oscillator functioning at around 2V operating voltage, use of 3.3V capable native NMOS (low-Vt) transistors are required instead of standard VT NMOS transistor switches. However, using a native NMOS transistor switch will not isolate the oscillator Gm-driver transistor sufficiently to prevent excessive current leakage paths when the GPIO pads associated with the crystal oscillator circuit are driven by CMOS logic when in an "external clock" mode, or other uses of these GPIO pads. Therefore, the CMOS IIH leakage current specification cannot be met.

SUMMARY

Therefore, what is needed is a low voltage crystal oscillator having an isolation circuit that is compatible with the complementary metal oxide semiconductor (CMOS) input-leakage high (IIH) specification for shared general-purpose input-output (GPIO) pads and still function at or below two (2) volts DC.

According to an embodiment, a crystal oscillator circuit having low leakage current isolation may comprise: a Gm-driver transistor; a constant current source coupled between a voltage source and a drain of the NMOS Gm-driver transistor; first and second Gm driver bias resistors coupled in series between the drain and a gate of the NMOS Gm-driver transistor; a current leakage reduction transistor coupled between a junction of the first and second Gm driver bias resistors and a voltage source common; first and second connection nodes adapted for coupling to a frequency determining crystal; a first isolation transistor coupled between the first connection node and the gate of the current leakage reduction transistor; a second isolation transistor coupled between the second connection node and the drain of the Gm-driver transistor; wherein when the first and second isolation transistors may be turned on the gate and drain of the Gm-driver transistor may be coupled to the first and second connection nodes, respectively, and the current leakage reduction transistor may be turned off, and when the first and second isolation transistors may be turned off the gate and drain of the Gm-driver transistor may be decoupled from the first and second connection nodes, respectively, and the current leakage reduction transistor may be turned on which couples the junction of the first and second Gm driver bias resistors to the voltage source common whereby the first and second isolation transistors self-limit current therethrough.

According to a further embodiment, the Gm-driver transistor may be a N-channel metal oxide semiconductor field effect transistor (NMOS FET). According to a further embodiment, the current leakage reduction transistor may be a N-channel metal oxide semiconductor field effect transistor (NMOS FET). According to a further embodiment, the first and second isolation transistors may be N-channel metal oxide semiconductor field effect transistors (NMOS FETs). According to a further embodiment, the first and second isolation transistors may be low-threshold voltage native NMOS FETs. According to a further embodiment, a combined series resistance of the first and second Gm driver bias resistors may be about seven (7) megohms. According to a further embodiment, a combined series resistance of the first and second Gm driver bias resistors may be from about five (5) megohms to about ten (10) megohms.

According to a further embodiment, a clock buffer may have inputs coupled to the Gm-driver transistor and a clock output. According to a further embodiment, when the first and second isolation transistors may be turned off their leakage current may meet a complementary metal oxide semiconductor (CMOS) input-leakage high (IIH) specification for shared general-purpose input-output (GPIO) nodes. According to a further embodiment, the first and second connection nodes may be adapted to be first and second general purpose input output (GPIO) nodes, respectively.

According to another embodiment, a microprocessor may comprise: a central processing unit (CPU) and memory; a crystal oscillator circuit having low leakage current isolation that may comprise: a Gm-driver transistor; a constant current source coupled between a voltage source and a drain of the NMOS Gm-driver transistor; first and second Gm driver bias resistors coupled in series between the drain and a gate of the NMOS Gm-driver transistor; a current leakage reduction transistor coupled between a junction of the first and second Gm driver bias resistors and a voltage source common; first and second connection nodes adapted for coupling to a frequency determining crystal; a first isolation transistor coupled between the first connection node and the gate of the Gm-driver transistor; a second isolation transistor coupled between the second connection node and the drain of the Gm-driver transistor; wherein when the first and second isolation transistors may be turned on the gate and drain of the Gm-driver transistor may be coupled to the first and second connection nodes, respectively, and the current leakage reduction transistor may be turned off, and when the first and second isolation transistors may be turned off the gate and drain of the Gm-driver transistor may be decoupled from the first and second connection nodes, respectively, and the current leakage reduction transistor may be turned on which couples the junction of the first and second Gm driver bias resistors to the voltage source common whereby the first and second isolation transistors self-limit current therethrough; and at least one function module, wherein the at least one function module may be coupled to the first and second connection nodes through isolation switches, whereby the oscillator circuit or the at least one function module uses the first and second connection nodes for coupling thereto.

According to a further embodiment, the at least one function module may be an analog function module. According to a further embodiment, the at least one function module may be a digital function module. According to a further embodiment, an integrated circuit package may have the first and second connection nodes adapted as external connections on the integrated circuit package. According to a further embodiment, a frequency determining crystal may be coupled to the external connections on the integrated circuit package.

According to yet another embodiment, a method of coupling and decoupling a crystal oscillator with low resistance on and high resistance off isolation switches may comprise the steps of: providing a crystal oscillator comprising a Gm-driver transistor; first and second Gm driver bias resistors coupled in series between the drain and a gate of the NMOS Gm-driver transistor; and a constant current source coupled between a voltage source and a drain of the NMOS Gm-driver transistor; providing an isolation circuit comprising a current leakage reduction transistor coupled between a junction of the first and second Gm driver bias resistors and a voltage source common; first and second connection nodes adapted for coupling to a frequency determining crystal; a first isolation transistor coupled between the first connection node and the gate of the Gm-driver transistor; a second isolation transistor coupled between the second connection node and the drain of the Gm-driver transistor; coupling the gate and drain of the Gm-driver transistor to the first and second connection nodes, respectively, when the first and second isolation transistors may be turned on and the current leakage reduction transistor may be turned off; and decoupling the gate and drain of the Gm-driver transistor from the first and second connection nodes, respectively, when the first and second isolation transistors may be turned off and the current leakage reduction transistor may be turned on.

According to a further embodiment of the method, may comprise the step of current self-limiting the first and second isolation transistors when the current leakage reduction transistor may be turned on. According to a further embodiment of the method, may comprise the step of buffering an output of the Gm-driver transistor with a clock buffer. According to a further embodiment of the method, may comprise the step of coupling the first and second connection nodes to first and second general purpose input-output (GPIO) nodes, respectively. According to a further embodiment of the method, may comprise the step of providing an integrated circuit package having external connections thereon as the first and second general purpose input-output (GPIO) nodes.

BRIEF DESCRIPTION OF THE DRAWINGS

A more complete understanding of the present disclosure may be acquired by referring to the following description taken in conjunction with the accompanying drawings wherein.

Figure 1:
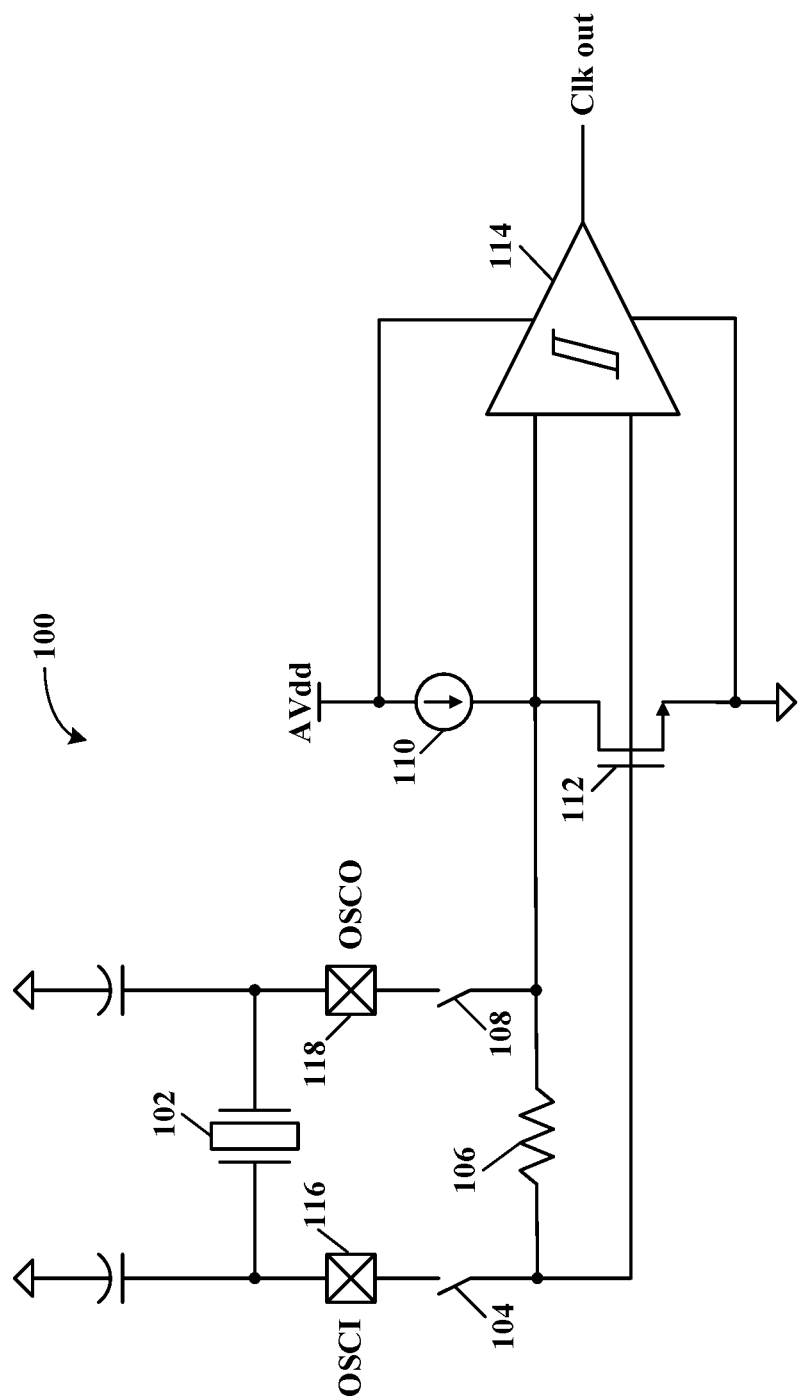
FIG. 1 illustrates a schematic diagram of a NMOS transistor driver-based crystal oscillator circuit having isolation switches, according teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

Various embodiments of the present disclosure may be configured to enable crystal oscillator functionality at a power supply voltage (Vdd) less than a field-effect transistor (FET) threshold (2-Vt). The FET threshold (2-Vt) may be the minimum gate-to-source voltage that is required to create a low resistance path between the source and drain of the FET. In some embodiments, crystal oscillator functionality may be enabled at a Vdd less than the FET threshold. In further embodiments, crystal oscillator functionality may be enabled at Vdd less than the FET threshold while retaining a shared GPIO feature. Vdd and AVdd (analog Vdd) will be used interchangeably herein. Gm (transconductance) of a metal oxide semiconductor field effect transistor (MOSFET) is the change in the drain current divided by the small change in the gate/source voltage with a constant drain/source voltage.

Referring now to the drawings, the details of example embodiments are schematically illustrated. Like elements in the drawings will be represented by like numbers, and similar elements will be represented by like numbers with a different lower-case letter suffix.

Referring now to FIG. 1, depicted is a schematic diagram of a NMOS transistor driver-based crystal oscillator circuit having isolation switches, according teachings of this disclosure. A crystal oscillator circuit having isolation switches, generally represented by the numeral 100, may comprise a clock buffer 114, a constant current source 110, a Gm driver transistor 112, a Gm driver bias resistor 106, isolation switches 104 and 108, GPIO nodes 116 and 118, and an oscillator frequency determining crystal 102. Capacitors shown coupled to the crystal 102 and the GPIO nodes 116 and 118 may be included in a crystal oscillator design but are not discussed further herein.

When the GPIO nodes 116 and 118 (OSCI and OSCO, respectively) are used to couple the crystal 102 to the Gm driver transistor 112, the isolation switches 104 and 108 are closed. And when the GPIO nodes 116 and 118 are used for another circuit function, the isolation switches 104 and 108 are open. *** The isolation switches 104 and 108 are representative only, and N-type metal-oxide-semiconductor (NMOS) transistors would be used for these isolation switches. Normally these NMOS transistor isolation switches would be implemented as 3.3V capable standard Vt NMOS transistors to guarantee lowest leakage current when disabled (off). However, low-voltage operation of the NMOS Gm-driver (transistor 112) based crystal oscillator circuit 100 is limited by the minimum Vdd required to turn on the series isolation switches 104 and 108 (1-NMOS diode+1 Vt NMOS switch) that couple the oscillator circuit to the external frequency determining crystal 102 through the GPIO pads 116 and 118. A NMOS+PMOS complementary switch (full transmission gate) will not work either since the signal may be around the NMOS Vt which is close to AVSS (analog common or ground).

An implicit requirement for lowest resistance of the isolation switches 104 and 108 when on is to supply an AVDD of at least 2 volts to guarantee oscillator circuit functionality. One solution to enable lower voltage operation than 2 volts is to implement the isolation switches as 3.3V capable native NMOS (with low-Vt) transistors instead of standard Vt NMOS transistors. However, simply using native NMOS transistors for isolation switches 104 and 108 may not decouple (isolate) the oscillator Gm-driver transistor 112 sufficiently, may cause additional leakage paths if the GPIO pads 116 and/or 118 are/is driven by CMOS logic, e.g., in an external clock (EC) mode, and native transistors leak even when disabled due to their very low threshold voltage, Vt.

Figure 2:
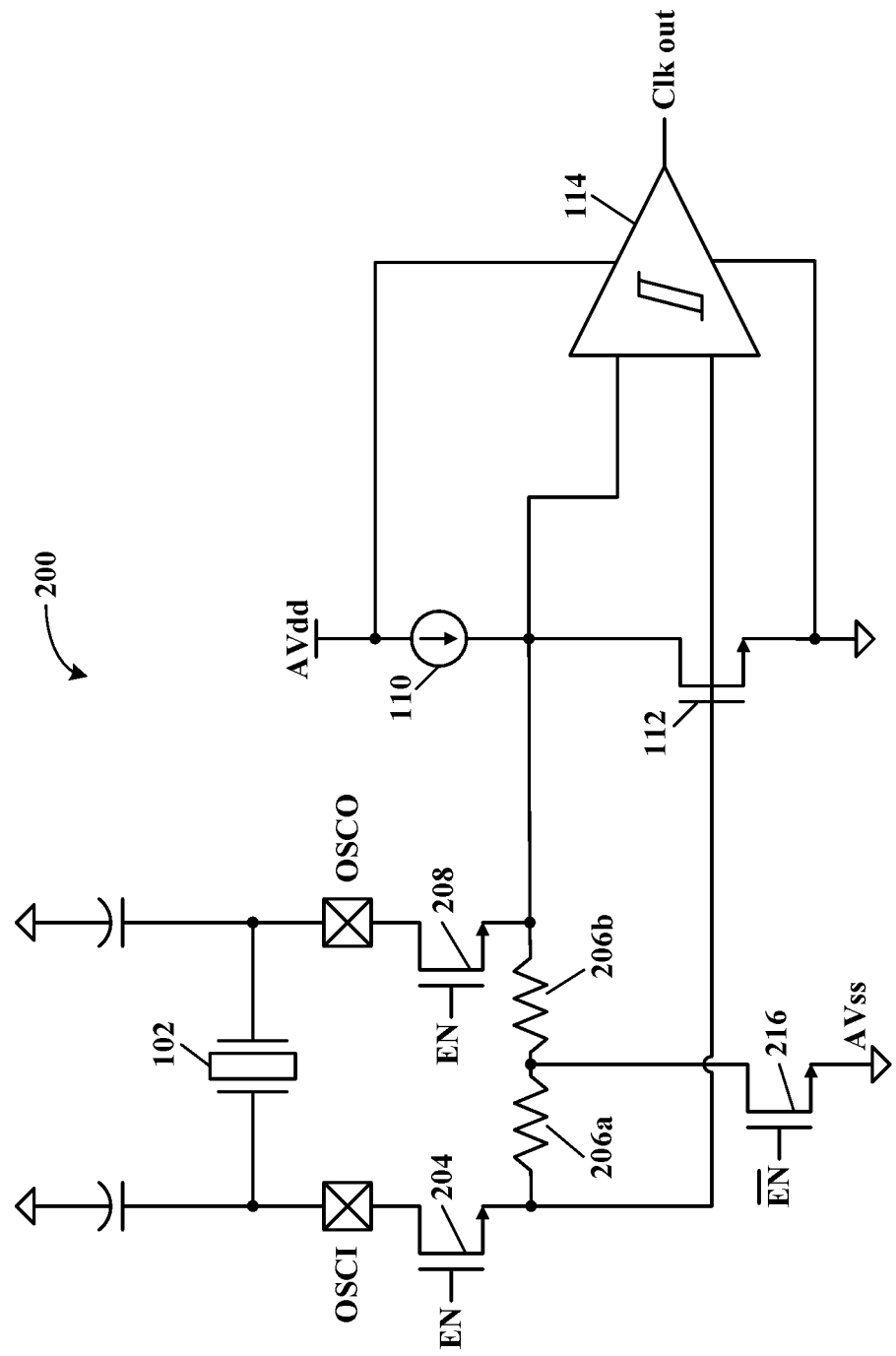
FIG. 2 illustrates a schematic diagram of a NMOS transistor driver-based crystal oscillator circuit having native NMOS transistor isolation switches, according to a specific example embodiment of this disclosure.

Referring now to FIG. 2, depicted is a schematic diagram of a NMOS transistor driver-based crystal oscillator circuit having native NMOS transistor isolation switches, according to a specific example embodiment of this disclosure. A crystal oscillator circuit having native NMOS transistors for isolation switches, generally represented by the numeral 200, may comprise a clock buffer 114, a constant current source 110, a Gm driver transistor 112, Gm driver bias resistors 206a and 206b, a current leakage reduction transistor 216, native NMOS transistors 204 and 208, GPIO nodes 116 and 118, and an oscillator frequency determining crystal 102. Capacitors shown coupled to the crystal 102 and the GPIO nodes 116 and 118 may be included in a crystal oscillator design but are not discussed further herein.

To address the excess leakage current problem when the native NMOS transistors 204 and 208 (isolation switches) are off, embodiments of the present disclosure may repurpose the Gm driver bias resistors 206a and 206b to reduce the leakage current of the off-state native NMOS transistors 204 and 208 and thereby ensure compliance with the CMOS IIH leakage current specification. When the NMOS transistors 204 and 208 are turned off (EN at a logic "0") the current leakage reduction transistor 216 is turned on (/EN at a logic "1") and the common node of the Gm driver bias resistors 206a and 206b are coupled to power supply common, e.g., Vss. This configuration will degenerate the native NMOS transistors 204 and 208 used as isolation switches to self-limit current through them when off, e.g., during an "external clock (EC)" mode.

When EN is at a logic "1" the NMOS transistors 204 and 208 isolation switches achieve a very low ON-resistance at the lowest possible operating voltage, Vdd. When EN is at a logic "0" the NMOS transistors 204 and 208 isolation switches are at a substantially lower leakage current that may easily meet the CMOS IIH leakage current specification during the CMOS EC mode due to NMOS transistors 204 and 208 being degenerated when the common node of the Gm driver bias resistors 206a and 206b are pulled to VSS by the current leakage reduction transistor 216.

Thus, the isolation circuit shown in FIG. 2 may satisfy the two otherwise conflicting requirements for isolation switches, namely the lowest ON-resistance at Vdd minimum when enabled, and a high OFF-resistant at Vdd maximum when the oscillator circuit is disabled. A high OFF-resistant at Vdd maximum when an oscillator is disabled may correspond to another device using the GPIO node(s). Thus, the embodiments disclosed herein may accomplish these two requirements by just repurposing the Gm driver bias resistors 206a and 206b and adding a current leakage reduction transistor 216. The resistance values of the Gm driver bias resistors 206a and 206b may be selected to ensure normal operation of the Gm driver transistor 112 and may have a combined resistance of, for example but is not limited to, from about five (5) megohms to about ten (10) megohms, and can even be lower, e.g., a few megohms. But a lower resistance Gm driver bias resistor means higher leakage in the disable mode. A high resistance range may be limited by silicon die area and oscillator startup time in practical terms.

Figure 3:
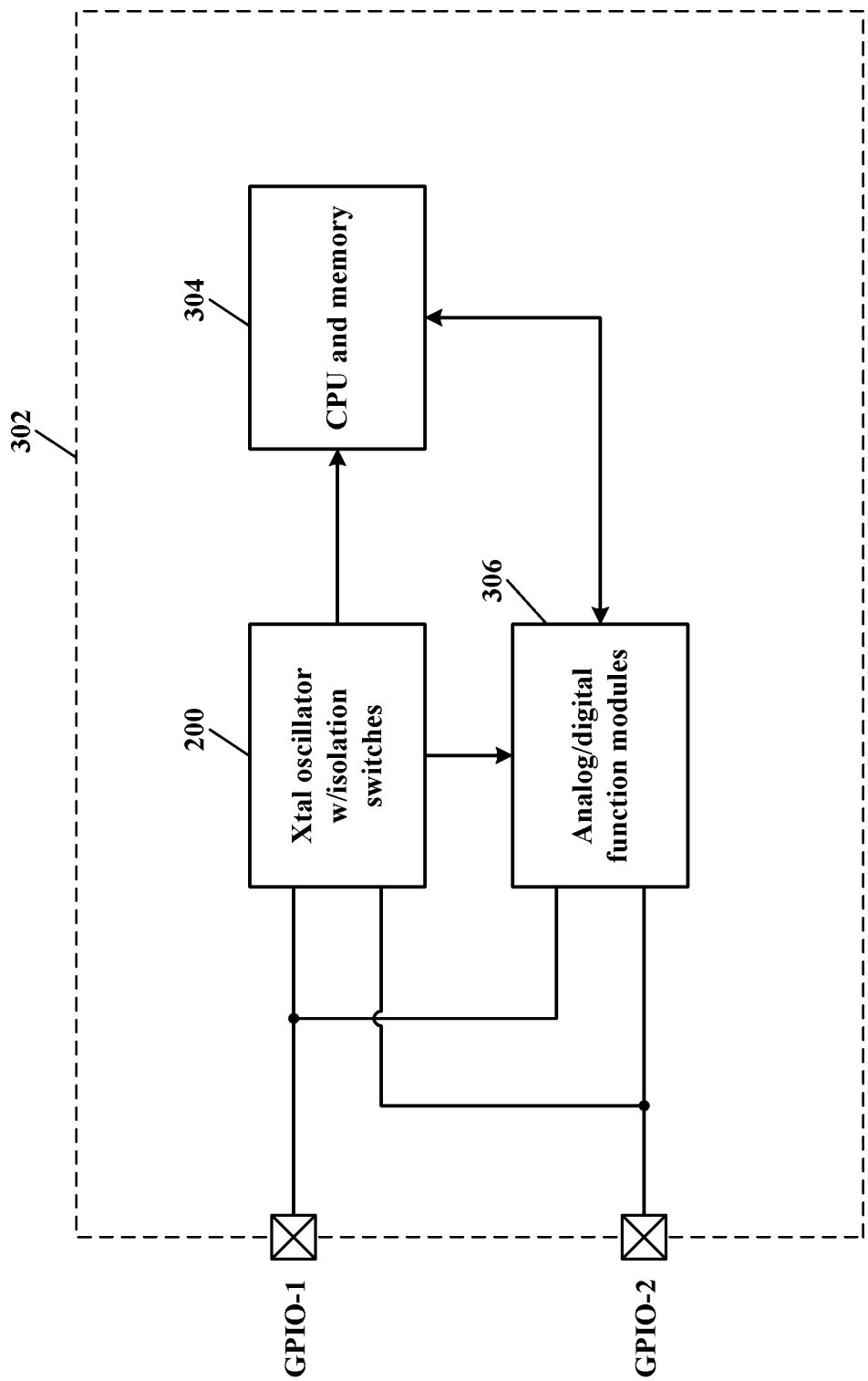
FIG. 3 illustrates a schematic block diagram of a microcontroller comprising the crystal oscillator circuit of FIG. 2, according to specific example embodiments of this disclosure.

Referring now to FIG. 3, depicted is a schematic block diagram of a microcontroller comprising the crystal oscillator circuit of FIG. 2, according to specific example embodiments of this disclosure. A microcontroller integrated circuit 302 may comprise a central processing unit (CPU) and memory 304 (e.g., program and data memory), at least one analog and/or digital function module 306 and a crystal oscillator having isolation switches 200, according to the circuit shown in FIG. 2. The crystal oscillator 200 and the at least one function module 306 may be coupled to GPIO-1 and GPIO-2 and alternately use these GPIO nodes. The microcontroller integrated circuit 302 may comprise an integrated circuit package having external connection pads thereon, e.g., GPIO-1 and GPIO-2.

Accordingly, embodiments of the present disclosure may guarantee crystal oscillator functionality when Vdd is less than the FET threshold voltage. This may be a requirement for deep sleep solutions. Furthermore, embodiments of the present disclosure may remain GPIO specification compliant at these low operating voltages. For example, a lithium battery, when charged, may have a voltage of 3.65V and when discharged may have a voltage of only 1.9V, reflecting about 50 percent of its potential life. The oscillator circuit 200 being able to function at this low of a supply voltage is very advantageous.

The present invention has been described in terms of one or more preferred embodiments, and it should be appreciated that many equivalents, alternatives, variations, and modifications, aside from those expressly stated (e.g., methods of manufacturing, product by process, and so forth), are possible and within the scope of the invention.

What is claimed is:

1. A crystal oscillator circuit having low leakage current isolation, comprising:
    an NMOS Gm-driver transistor;
    a constant current source coupled between a voltage source and a drain of the NMOS Gm-driver transistor;
    first and second Gm driver bias resistors coupled in series between the drain and a gate of the NMOS Gm-driver transistor;
    a current leakage reduction transistor coupled between a junction of the first and second Gm driver bias resistors and a voltage source common;
    first and second connection nodes adapted for coupling to a frequency determining crystal;
    a first isolation transistor coupled between the first connection node and the gate of the current leakage reduction transistor;
    a second isolation transistor coupled between the second connection node and the drain of the NMOS Gm-driver transistor;
    wherein
        when the first and second isolation transistors are turned on the gate and drain of the NMOS Gm-driver transistor are coupled to the first and second connection nodes, respectively, and the current leakage reduction transistor is turned off, and when the first and second isolation transistors are turned off the gate and drain of the NMOS Gm-driver transistor are decoupled from the first and second connection nodes, respectively, and the current leakage reduction transistor is turned on which couples the junction of the first and second Gm driver bias resistors to the voltage source common whereby the first and second isolation transistors self-limit current therethrough.

2. The crystal oscillator circuit according to claim 1, wherein the Gm-driver transistor is a N-channel metal oxide semiconductor field effect transistor (NMOS FET).

3. The crystal oscillator circuit according to claim 1, wherein the current leakage reduction transistor is a N-channel metal oxide semiconductor field effect transistor (NMOS FET).

4. The crystal oscillator circuit according to claim 1, wherein the first and second isolation transistors are N-channel metal oxide semiconductor field effect transistors (NMOS FETs).

5. The crystal oscillator circuit according to claim 4, wherein the first and second isolation transistors are low-threshold voltage native NMOS FETs.

6. The crystal oscillator circuit according to claim 1, wherein a combined series resistance of the first and second Gm driver bias resistors is about seven (7) megohms.

7. The crystal oscillator circuit according to claim 1, wherein a combined series resistance of the first and second Gm driver bias resistors is from about five (5) megohms to about ten (10) megohms.

8. The crystal oscillator circuit according to claim 1, further comprising a clock buffer having inputs coupled to the NMOS Gm-driver transistor and a clock output.

9. The crystal oscillator circuit according to claim 1, wherein when the first and second isolation transistors are turned off their leakage current meets a complementary metal oxide semiconductor (CMOS) input-leakage high (IIH) specification for shared general-purpose input-output (GPIO) nodes.

10. The crystal oscillator circuit according to claim 1, wherein the first and second connection nodes are adapted to be first and second general purpose input output (GPIO) nodes, respectively.

11. A microprocessor, comprising:
a central processing unit (CPU) and memory;
a crystal oscillator circuit having low leakage current isolation, comprising
an NMOS Gm-driver transistor;
a constant current source coupled between a voltage source and a drain of the NMOS Gm-driver transistor;
first and second Gm driver bias resistors coupled in series between the drain and a gate of the NMOS Gm-driver transistor;
a current leakage reduction transistor coupled between a junction of the first and second Gm driver bias resistors and a voltage source common;
first and second connection nodes adapted for coupling to a frequency determining crystal;
a first isolation transistor coupled between the first connection node and the gate of the NMOS Gm-driver transistor;
a second isolation transistor coupled between the second connection node and the drain of the NMOS Gm-driver transistor;
wherein
when the first and second isolation transistors are turned on the gate and drain of the NMOS Gm-driver transistor are coupled to the first and second connection nodes, respectively, and the current leakage reduction transistor is turned off, and
when the first and second isolation transistors are turned off the gate and drain of the NMOS Gm-driver transistor are decoupled from the first and second connection nodes, respectively, and the current leakage reduction transistor is turned on which couples the junction of the first and second Gm driver bias resistors to the voltage source common whereby the first and second isolation transistors self-limit current therethrough; and
at least one function module, wherein the at least one function module is coupled to the first and second connection nodes through isolation switches, whereby the oscillator circuit or the at least one function module uses the first and second connection nodes for coupling thereto.

12. The microprocessor according to claim 11, wherein the at least one function module is an analog function module.

13. The microprocessor according to claim 11, wherein the at least one function module is a digital function module.

14. The microprocessor according to claim 11, further comprising an integrated circuit package and having the first and second connection nodes adapted as external connections on the integrated circuit package.

15. The microprocessor according to claim 14, further comprising a frequency determining crystal coupled to the external connections on the integrated circuit package.

16. A method of coupling and decoupling a crystal oscillator with low resistance on and high resistance off isolation switches, said method comprising the steps of:
providing a crystal oscillator comprising
an NMOS Gm-driver transistor;
first and second Gm driver bias resistors coupled in series between the drain and a gate of the NMOS Gm-driver transistor; and
a constant current source coupled between a voltage source and a drain of the NMOS Gm-driver transistor;
providing an isolation circuit comprising
a current leakage reduction transistor coupled between a junction of the first and second Gm driver bias resistors and a voltage source common;
first and second connection nodes adapted for coupling to a frequency determining crystal;
a first isolation transistor coupled between the first connection node and the gate of the NMOS Gm-driver transistor;
a second isolation transistor coupled between the second connection node and the drain of the NMOS Gm-driver transistor;
coupling the gate and drain of the NMOS Gm-driver transistor to the first and second connection nodes, respectively, when the first and second isolation transistors are turned on and the current leakage reduction transistor is turned off; and
decoupling the gate and drain of the NMOS Gm-driver transistor from the first and second connection nodes, respectively, when the first and second isolation transistors are turned off and the current leakage reduction transistor is turned on.

17. The method according to claim 16, further comprising the step of current self-limiting the first and second isolation transistors when the current leakage reduction transistor is turned on.

18. The method according to claim 16, further comprising the step of buffering an output of the Gm-driver transistor with a clock buffer.

19. The method according to claim 16, further comprising the step of coupling the first and second connection nodes to first and second general purpose input-output (GPIO) nodes, respectively.

20. The method according to claim 19, further comprising the step of providing an integrated circuit package having external connections thereon as the first and second general purpose input-output (GPIO) nodes.

* * * * *